(12) United States Patent
Nittka et al.

(10) Patent No.: US 10,921,406 B2
(45) Date of Patent: Feb. 16, 2021

(54) MAGNETIC RESONANCE FINGERPRINTING METHOD AND APPARATUS

(71) Applicant: Siemens Healthcare GmbH, Erlangen (DE)

(72) Inventors: Mathias Nittka, Baiersdorf (DE); Gregor Koerzdoerfer, Erlangen (DE); Josef Pfeuffer, Kunreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 68 days.

(21) Appl. No.: 16/441,383

(22) Filed: Jun. 14, 2019

(65) Prior Publication Data

US 2019/0383892 A1 Dec. 19, 2019

(30) Foreign Application Priority Data

Jun. 14, 2018 (DE) .................... 10 2018 209 584

(51) Int. Cl.
| | |
|---|---|
| *G06T 11/00* | (2006.01) |
| *G06T 7/00* | (2017.01) |
| *G01R 33/48* | (2006.01) |
| *G01R 33/561* | (2006.01) |
| *G01R 33/56* | (2006.01) |

(52) U.S. Cl.
CPC ..... *G01R 33/4828* (2013.01); *G01R 33/4824* (2013.01); *G01R 33/5608* (2013.01); *G01R 33/5614* (2013.01); *G06T 7/0016* (2013.01); *G06T 11/005* (2013.01); *G06T 11/008* (2013.01); *G06T 2207/10088* (2013.01); *G06T 2207/20182* (2013.01)

(58) Field of Classification Search
CPC combination set(s) only.
See application file for complete search history.

(56) References Cited

U.S. PATENT DOCUMENTS

| | | | |
|---|---|---|---|
| 9,633,455 B1* | 4/2017 | Mailhe | G01R 33/50 |
| 10,162,031 B2* | 12/2018 | Tunnicliffee | G01R 33/448 |
| 10,634,748 B2* | 4/2020 | Irfanullah | G01R 33/50 |
| 2013/0271132 A1* | 10/2013 | Griswold | G01R 33/56 |
| | | | 324/309 |

(Continued)

OTHER PUBLICATIONS

Jiang, Yun et al., "MR Fingerprinting Using Fast Imaging with Steady State Precession (FISP) with Spiral Readout", Magnetic Resonance in Medicine, vol. 74, pp. 1621-1631, 2015 // DOI: 10.1002/mrm.25559.

(Continued)

*Primary Examiner* — Iman K Kholdebarin
(74) *Attorney, Agent, or Firm* — Schiff Hardin LLP

(57) ABSTRACT

In a magnetic resonance fingerprinting method and apparatus for improved determination of local parameter values of an examination object, in which at least two signal comparisons of acquired picture element time series are carried out with comparison signal curves for determination of parameter values. A further (subsequent) signal comparison takes into account results of a preceding signal comparison. This multi-stage determination of parameter values allows an increase of the spatial resolution and the precision with which the parameter values can be determined.

17 Claims, 5 Drawing Sheets

(56) References Cited

U.S. PATENT DOCUMENTS

| | | | | |
|---|---|---|---|---|
| 2015/0301141 A1* | 10/2015 | Griswold | ........... | G01R 33/5608 |
| | | | | 382/131 |
| 2015/0301142 A1* | 10/2015 | Griswold | ........... | G01R 33/4828 |
| | | | | 324/309 |
| 2015/0302579 A1* | 10/2015 | Griswold | ........... | G01R 33/5608 |
| | | | | 382/128 |
| 2016/0155238 A1* | 6/2016 | Bachschmidt | ......... | A61B 5/743 |
| | | | | 382/131 |
| 2016/0299206 A1* | 10/2016 | Cohen | ................ | G01R 33/54 |
| 2017/0052240 A1* | 2/2017 | Lauer | ................. | G01R 33/5608 |
| 2017/0115368 A1* | 4/2017 | Chen | ................. | G01R 33/4824 |
| 2017/0178319 A1* | 6/2017 | Sugiura | .............. | G01R 33/5602 |
| 2017/0309019 A1* | 10/2017 | Knoll | ........................ | G06T 5/00 |
| 2018/0005417 A1* | 1/2018 | Schieke | ................ | G06T 7/0016 |
| 2018/0074148 A1* | 3/2018 | Pfeuffer | ............. | G01R 33/5608 |
| 2018/0203082 A1* | 7/2018 | Griswold | ................ | G06F 16/56 |
| 2018/0217220 A1* | 8/2018 | Gulani | ............... | G01R 33/5613 |
| 2018/0231626 A1* | 8/2018 | Gulani | ................. | A61B 5/4312 |
| 2018/0268942 A1* | 9/2018 | Kamali-Zare | ........ | A61B 5/7278 |
| 2018/0286041 A1* | 10/2018 | Hu | ........................ | G06T 7/0012 |
| 2018/0292493 A1* | 10/2018 | Griswold | ................ | G01R 33/50 |
| 2018/0321345 A1* | 11/2018 | Van Den Brink | .... | G06T 11/003 |
| 2019/0102516 A1* | 4/2019 | Schieke | ................. | G16H 30/40 |
| 2019/0221314 A1* | 7/2019 | Hennig | .................. | G16H 50/20 |
| 2019/0340463 A1* | 11/2019 | Nittka | .................... | G01R 33/56 |
| 2019/0361080 A1* | 11/2019 | Nittka | ................ | G01R 33/5608 |
| 2019/0377046 A1* | 12/2019 | Nickel | ............... | G01R 33/5608 |
| 2020/0005497 A1* | 1/2020 | Arberet | ................. | G06T 11/006 |
| 2020/0041595 A1* | 2/2020 | Flask | ..................... | G01R 33/50 |
| 2020/0096589 A1* | 3/2020 | Sommer | ................. | G16H 30/20 |
| 2020/0191893 A1* | 6/2020 | Grodzki | ................. | G01R 33/54 |

OTHER PUBLICATIONS

German action dated Jun. 26, 2020, Application No. 10 2018 209 584.1.

Ma, Dan et al.: "Magnetic Resonance Fingerprinting"; in: Nature; 1 vol. 495; No. 7440; pp. 187-192; Mar. 4, 2013 // DOI:10.1038/nature11971.

* cited by examiner

FIG 4
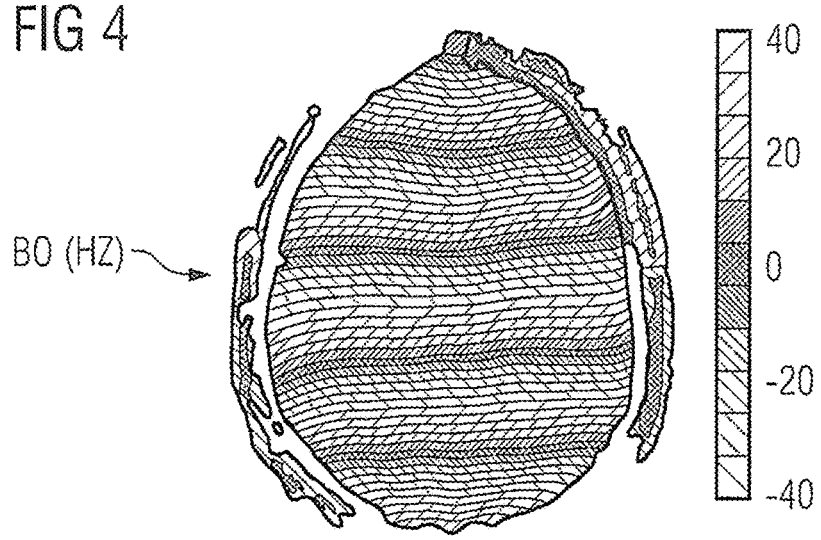
B0 (HZ)
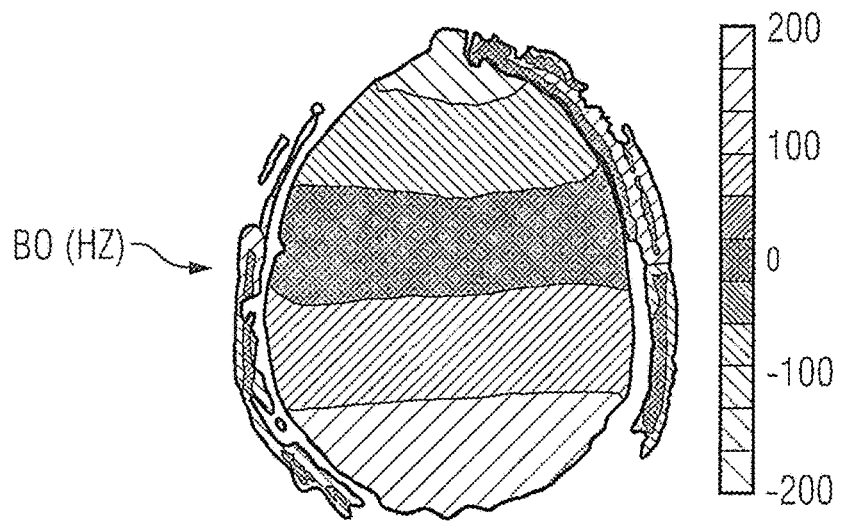
B0 (HZ)
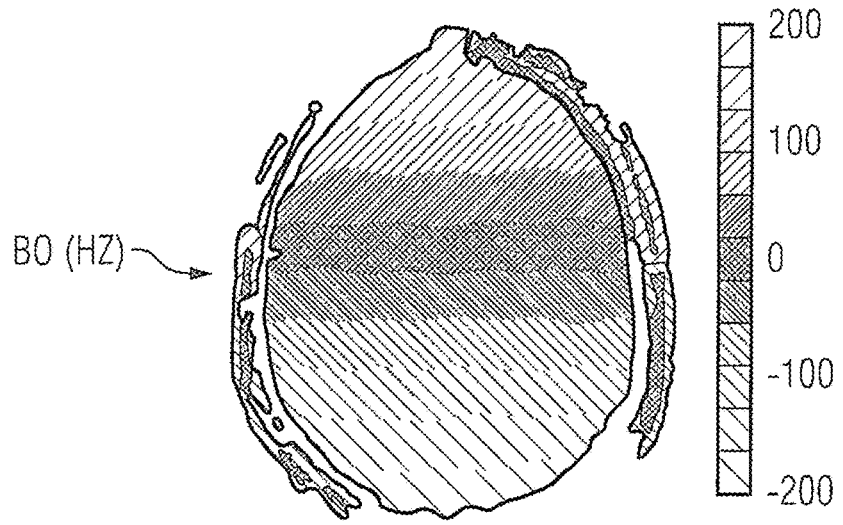
B0 (HZ)

MAGNETIC RESONANCE FINGERPRINTING METHOD AND APPARATUS

BACKGROUND OF THE INVENTION

Field of the Invention

The present invention concerns a magnetic resonance fingerprinting method for improved determination of local parameter values of an examination object, as well as a magnetic resonance apparatus and a non-transitory, data storage medium that implements such a method.

Description of the Prior Art

Magnetic resonance (MR) is a known modality with which images can be created of the inside of an examination object. Expressed in simple terms, the examination object is positioned in a magnetic resonance scanner in a strong static, homogeneous basic magnetic field, also called the B0 field, with field strengths of 0.2 Tesla to 7 Tesla and more, so that nuclear spins in the object are oriented along the basic magnetic field. To trigger nuclear spin resonances, radio-frequency excitation pulses (RF pulses) are irradiated into the examination object. The triggered nuclear spin resonances are measured as so-called k-space data, and MR images are reconstructed on the basis of k-space data, or spectroscopy data are produced. For spatial encoding of the measurement data, rapidly switched magnetic gradient fields, which define the trajectories along which the detected MR signals are entered into k-space, are superimposed on the basic magnetic field. The recorded measurement data are digitized and stored as complex numeric values in a k-space matrix. An associated MR image is reconstructed from the values in k-space, e.g. by a multi-dimensional Fourier transformation. A series of RF pulses to be radiated in a specific manner, gradients to be switched, and readout processes used for this purpose, is referred to as a sequence.

Different types of sequence are known, which have different sensitivities to parameters describing materials contained in an examined examination object (e.g. the longitudinal relaxation T1, the transverse relaxation T2 and the proton density). The MR images reconstructed from measurement data recorded with a specific sequence type accordingly show weighted images of the examination object according to the sensitivities of the sequence type used.

Magnetic resonance imaging by operation of a magnetic resonance system can serve to define the presence and/or a distribution of a material that is situated in an examination object. The substance can be a possibly pathological tissue of the examination object, a contrast medium, a marking material or a metabolism product.

Information about the materials that are present can be obtained from the recorded measurement data in a wide diversity of ways. A relatively simple source of information is image data reconstructed from the measurement data, for example. However there are also more complex methods, which establish information about the examined examination object from picture element time series of image data reconstructed from successively measured measurement datasets.

With the use of quantitative MR imaging techniques, absolute properties of the measured object are able to be determined. In the case of a human subject, such properties can be the tissue-specific T1 relaxation and T2 relaxation. By contrast, the conventional sequences used most often in clinical routine merely create a relative signal intensity of different tissue types (so-called weightings), so that the diagnostic interpretation is to a great extent dependent on the subjective estimation of the radiologist. Quantitative techniques thus offer the advantage of allowing an objective comparison, but because of long measurement times, are rarely currently used in clinical routines.

Newer quantitative measurement methods such as magnetic resonance fingerprinting methods (MRF methods) can reduce the said disadvantage of the long measurement times to an acceptable level. With MRF methods, signal curves for image data reconstructed from measurement data recorded after one another in time with different recording parameters for each picture element or at least picture elements of interest of the image data is considered as picture element time series, wherein the signal curve of a picture element time series is considered as a fingerprint of the parameters present in the picture element location of the examination object during the measurement. These signal curves are compared by pattern recognition with signal curves of a previously established database of signal curves characteristic of specific materials (referred to as the dictionary), in order to establish the materials represented in the image data reconstructed from the measurement data or the spatial distribution of tissue-specific parameters (such as the transversal relaxation T2 or the longitudinal relaxation T1; referred to as T1 and T2 maps) in the imaged examination object. The signal curves contained in a dictionary of this type can also have been created here by simulations.

The principle of this method is thus to compare measured signal curves with a number of stored signal curves measured previously. In such case signal curves can have been established for different combinations of T1 and T2 relaxation times, as well as other parameters, for the dictionary. The parameter values, e.g. T1 and T2 times, of a picture element (pixels/voxels) in the image will then be determined by the measured signal curve being compared with all or with a part of the simulated signal curves. This process is referred to as "matching". That signal curve of the dictionary that is most similar to the measured signal curve determines the parameters, e.g. relaxation parameters T1 and T2, of the respective picture element.

Basically in such cases, as well as the tissue-specific parameters of an examined object already mentioned, measurement-specific parameters, such as the field strengths of the applied B0 magnetic field, or the local distribution or the strength of a radiated radio-frequency field B1+, can be established, since signals recorded by MR techniques can depend on the tissue-specific parameters present in an examined object as well as on measurement-specific parameters, which describe the conditions present during the measurement. The recording parameters used are selected here such that the recorded measurement data shows a dependency on the desired parameters to be determined. For example sequence types for the MRF method can be employed that are sensitive to the desired parameters. Through the dependencies and the variation of the recording parameters and taking them into consideration in the comparison signal curves, the desired parameters are able to be determined from picture element-time series recorded in this way.

A widely-used MRF method is described in the article by Ma et al., "Magnetic Resonance Fingerprinting", Nature, 495: P. 187-192 (2013). In this article a TrueFISP ("true fast imaging with steady-state free precession")-based sequence is used in combination with a spiral-shaped k-space sampling. Because of the dependency of a signal recorded by means of a TrueFISP sequence on the static magnetic field B0, this parameter is likewise part of the signal model describing the signal and, when the picture element time series has been created using corresponding variation of the recording parameters, can basically be identified by an MRF dictionary match as well as T1 and T2 in each pixel. The strength of a recorded signal definitively depends with TrueFISP sequences on the local basic magnetic field B0, which varies spatially within an examination object. By variation of the repetition time TR, the B0 dependency of the signal can be changed. However with the MRF method (cf. the article by Ma et al. already mentioned) a relatively long readout duration for the spiral-shaped k-space sampling can be used to limit the possible durations of a repetition time TR downwards, so that a comparatively high lower limit for the repetition time TR exists. Therefore this can result in artifacts in the MRF measurements, which are very similar to what are referred to as banding artifacts in conventional TrueFISP sequences (cf. the article by Ma et al. noted above). Furthermore a spatial resolution that can be obtained with which the measurement-specific parameters of local magnetic field B0 can be determined with such an MRF technique are likewise limited on account of the described high low limit for the repetition time TR. This limitation of the spatial resolution leads to spatial distributions of the basic magnetic field B0 (B0 maps) determined in this way not being sufficiently highly resolved for some applications, e.g. corrections of artifacts resulting from the local deviations of the basic magnetic field from a global value.

For MRF methods, basically each echo technique can be used in combination with any given method for k-space sampling (e.g. Cartesian, spiral-shaped, radial). Non-Cartesian k-space samplings, such as radial or spiral-shaped k-space samplings, inherently cover the central area of k-space more densely with data entry points, compared to peripheral areas of k-space, this is advantageous for measurements with undersampling (in accordance with the Nyquist theorem) of k-space. Spatial encodings with spiral-shaped trajectories in k-space sampling, as are used, for example, in the aforementioned article by Ma et al. and as is shown herein as an example in FIG. 1, are often used for MRF methods due to their high efficiency, in particular their property of allowing a strong undersampling of k-space in relation to the Nyquist theorem, which makes especially short measurement times possible. However, these types of spiral-shaped spatial encodings are especially sensitive to off-resonances, i.e. local disruptions of the static magnetic field B0, so that unsharp areas, referred to as blurring artifacts, can occur in the images reconstructed from measurement data read out along a spiral shape.

SUMMARY OF THE INVENTION

An object of the invention is to make possible an improved determination of parameter values by the use of MRF methods.

An inventive method for determination of parameter values in picture elements of an examination object by use of a magnetic resonance fingerprinting (MRF) technique includes the following steps.

At least one picture element time series is produced in a computer from MRF data acquired by an MRF recording method, from which a value of at least one parameter that is present in the location shown by the respective picture element is to be determined.

A signal comparison is implemented in the computer of at least one section of the respective signal curve of the acquired picture element time series with a corresponding section of comparison signal curves, in order to determine the respective values of the at least one parameter.

A further signal comparison is implemented in the computer of at least one section of the respective signal curve, taking into account the results of the preceding signal comparison with a corresponding section of the comparison signal curve for improved determination of the respective values of the at least one parameter.

The values of the parameters that are determined in this improved manner for the respective picture element are represented in an output of the computer.

The inventive execution of a further signal comparison taking into account a preceding signal comparison and the step-by-step or multi-step determination of the parameter values associated therewith enables the parameters to be determined to be determined with a higher spatial resolution and with a higher precision.

Here, on the basis of a value of a parameter determined for a picture element with an inventive signal comparison, the picture element time series acquired corresponding to the picture element can be corrected, so that a corrected picture element time series is created.

A value of a parameter, in particular a value of a measurement-specific parameter such as the local magnetic field B0, can already be determined by the first signal comparison of at least one section of the signal curve of the acquired picture element time series with a corresponding section of the comparison signal curves ("dictionary"), and the acquired picture element time series can be corrected on the basis of the value of the parameter determined in the first signal comparison, so that a corrected picture element time series is created.

Corrections of image data based in particular on measurement-specific parameters are known. For example influences of inhomogeneities of the magnetic fields and/or radio-frequency fields used are frequently corrected after establishing the local distribution of the respective magnetic fields and/or radio-frequency fields. Such correction methods are also able to be applied here and can rectify artifacts in the picture element time series. They can thus increase the precision and freedom from artifacts of the corrected picture element time series underlying a further signal comparison, which has a positive effect on the precision of the values of the parameters determined.

If values of a number of different parameters have been determined in a preceding signal comparison, the picture element time series can be corrected, successively for example, on the basis of a number of the values determined.

The results of a preceding signal comparison can be taken into account in a further signal comparison, with the further signal comparison comparing a corrected picture element time series determined in such a way on the basis of parameter values determined in a preceding signal comparison with the comparison signal curves. Thus for taking into consideration the results of the preceding signal comparison in a further signal comparison, at least a section of the signal curve of the corrected picture element time series can be compared with a corresponding section of the comparison signal curves for improved determination of the values of the parameters to be determined.

The use of corrected picture element time series in the further signal comparison enables a higher precision of the parameter values determined in an improved manner to be achieved.

A corrected picture element time series can be corrected once again on the basis of an improved value of the parameter determined by signal comparison of the corrected picture element time series with the comparison signal curves, and the improved value of the parameter can be determined again in an improved manner by comparison of the picture element-time series corrected again with the comparison signal curves. Thus such a correction of a picture element time series can also be carried out multiple times, e.g. iteratively.

The renewed correction enables a higher precision both of the corrected picture element time series and also of the parameter values determined in an improved manner to be achieved.

A renewed correction of this type can be carried out until such time, e.g. iteratively, as a difference between values of the parameter determined once again in an improved manner and the corresponding values of the parameter determined before the corresponding correction is less than a predetermined threshold value.

The comparison between a difference of the values of a parameter to be determined that are determined in different signal comparisons and comparison of this difference with a predetermined threshold value guarantee that a precision of the respective value defined by the threshold value is achieved.

It is furthermore possible for values of at least two different parameters to be determined, and for taking into account of the results of the preceding signal comparison for signal comparisons for improved determination of the values of at least one parameter to be determined, which restricts the value or values of at least one other than the current parameter or parameters to be determined in an improved manner of the current improved parameters to be determined to a predetermined maximum variation compared to the result of the preceding signal comparison, in particular to keep them constant.

Through this type of restriction of and allowed fluctuation of values for a few parameters during the improved determination of a value of at least one other parameter, the computing effort can be kept low during the improved determination and the signal comparison for the parameter value to be determined in an improved manner can be carried out in an optimized manner, so that the precision of the improved parameter values is increased.

Here signal comparisons for improved determination of a parameter to be determined can be carried out until such time as the values of all parameters to be determined overall has been determined at least once with the improved determination or until all values of parameters to be determined have been determined with sufficient precision, e.g. in accordance with a check with a predetermined threshold value described above.

An inventive magnetic resonance apparatus has a scanner with a basic field magnet, a gradient unit, a radio-frequency unit, and the apparatus has a control computer configured to implement the inventive method, with a parameter value determination processor.

The present invention also encompasses a non-transitory, computer-readable data storage medium encoded with programming instructions (program code) that, when the storage medium is loaded into a stand-alone computer, or a control computer of a magnetic resonance apparatus, cause the stand-alone computer or the control computer to implement any or all embodiments of the method according to the invention, as described above.

The advantages and embodiments specified in relation to the method apply analogously to the magnetic resonance apparatus and the electronically-readable data medium.

BRIEF DESCRIPTION OF THE DRAWINGS

FIG. 4 shows diagrams of possible spatial distributions of a parameter determined for illustrating a compensation process in accordance with the invention.

DESCRIPTION OF THE PREFERRED EMBODIMENTS

Figure 1:
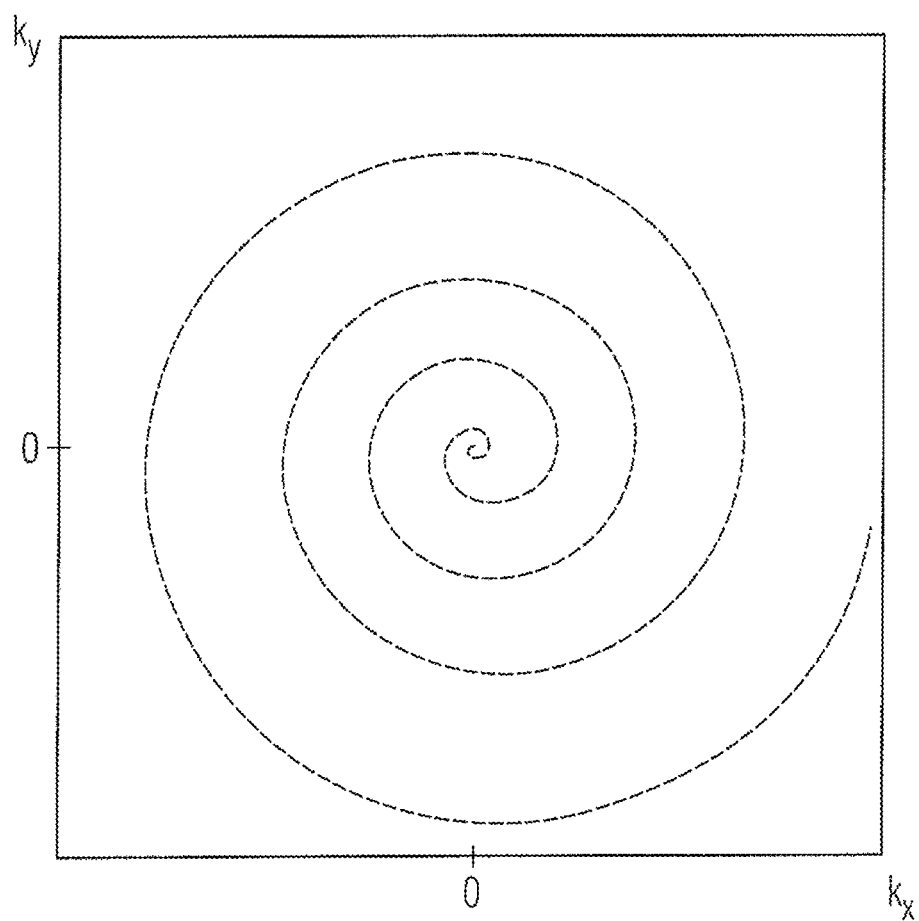
FIG. 1 shows an example of a spiral-shaped k-space trajectory.

FIG. 1 shows, as a dashed line, an example of a spiral-shaped k-space trajectory along which, after an RF excitation pulse, a set of measurement data is read out, from which an image dataset is reconstructed. To create this type of k-space trajectory, after an RF excitation pulse has been radiated into the examination object, gradient fields are switched in two phase encoded directions standing at right angles to one another (here x- and y-directions) in a known manner such that the spiral-shaped k-space trajectory is sampled. By repeated recording of such measurement datasets and reconstruction of associated image datasets, a series of image datasets is produced, in which a signal curve can be considered in each case in a matching of the picture elements of the image datasets in MRF methods as a picture element-time series and can be compared with comparison signal curves, in order to determine parameters present in the picture element considered in the examination object at the time of the measurement.

Figure 2:
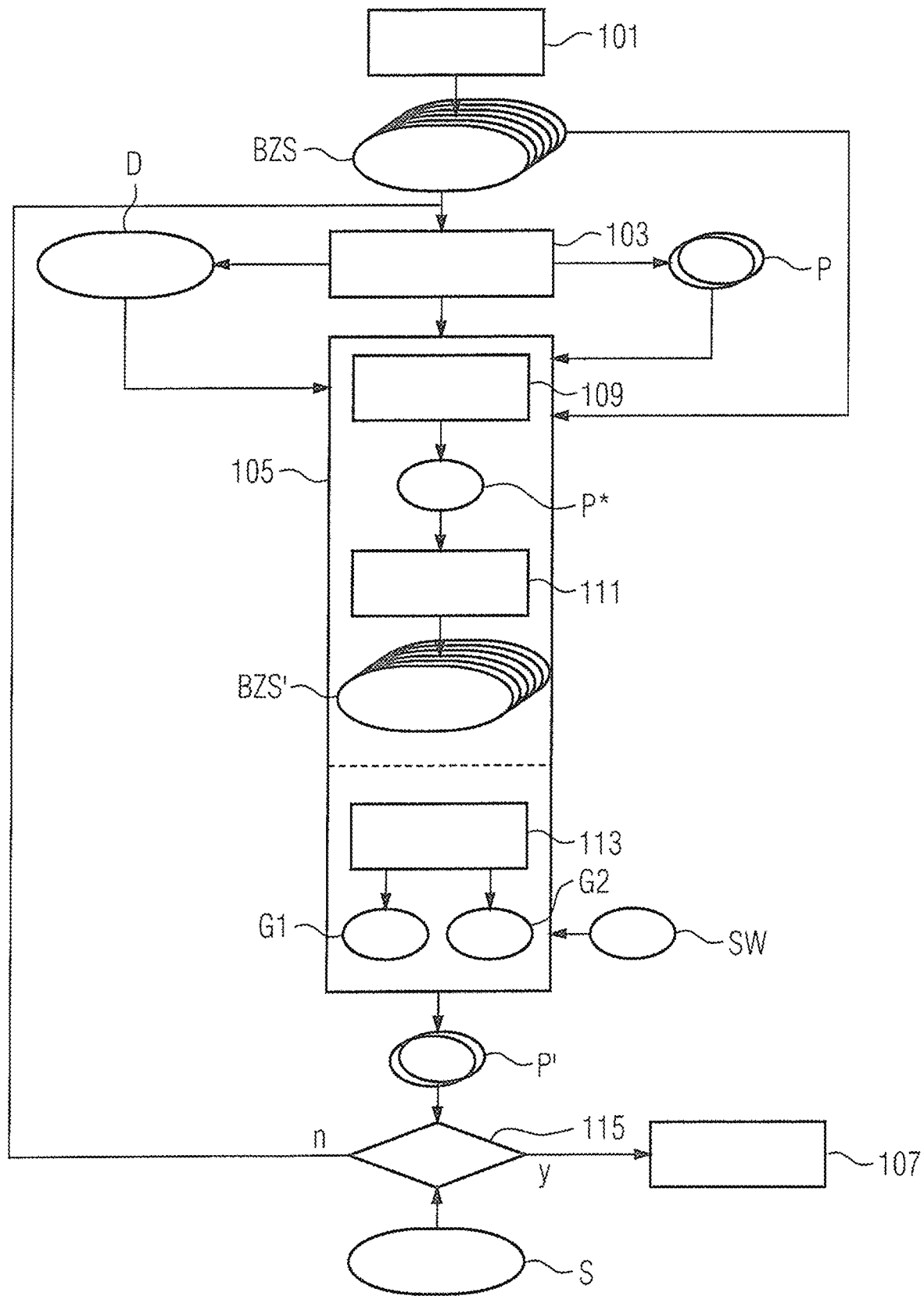
FIG. 2 is a flowchart of the inventive method.

FIG. 2 is a flowchart of an embodiment of the inventive method for determining a parameter values in picture elements of an examination object by use of an MRF technique.

In this method at least one picture element time series BZS is acquired by the execution of an MRF recording method, from which a respective value P of at least one parameter present of a location of the examination object shown in the respective picture element is to be determined, is acquired (block 101). In more precise terms with MRF methods series of images are typically recorded in a certain temporal sequence with variation of recording parameters. Each picture element of such a series of images common to the images of the series of images can be considered as a picture element time series BZS. All picture elements of the series of images can be considered as a respective picture element time series BZS or also only picture elements of interest, for example those that show an examination region (ROI, "Region Of Interest"). An MRF recording method used in the acquisition of the picture element time series defines the parameters to be determined. Advantageously an MRF recording method is used that allows the determination of a number of, in particular tissue-specific and also measurement-specific, parameters. An example for a suitable MRF recording scheme is described below in relation to FIG. 3. In general MRF recording techniques are preferred for which at least the parameters B0, T1 and T2, but also of course other parameters such as B1+, can be determined by a signal comparison by means of an MRF matching method.

A signal comparison is carried out (block 103), which compares the signal curve of at least one section of an acquired picture element time series with a corresponding section of comparison signal curves D, in order to determine a respective value P of the at least one parameter to be determined in the respective picture element. The determination of the values P of the parameters to be determined can be done in this case with a "matching" method usual with MRF methods with comparison signal curves D contained in a dictionary.

A further signal curve (block 105) is carried out, which compares at least one section of a respective signal curve taking into account the results of the preceding signal comparison 103 or, if this has already been done once, compares a signal curve 105 with a corresponding section of the comparison signal curves D, in order to determine the respective value P' of the at least one parameter in the respective picture element in an improved manner.

The values P' of the parameters to be determined that are determined in an improved manner can be stored and/or output to an output, e.g., in particular displayed in the form of parameter maps (block 107).

Thus the values P' of parameters to be determined are determined step-by-step in an improved manner in at least two signal comparisons 103 and 105.

In the signal curves used, in at least one signal comparison the signal curve of a complete picture element time series BZS can be compared with the complete curve of the comparison signal curves D.

Also, with the signal curves used, in at least one signal comparison of the signal curve in sections of a complete picture element time series BZS to be compared, which have been acquired with a sequence type sensitive to the parameters to be defined, can be compared with the corresponding sections of the comparison signal curves D. In this case although those signals of the sections of the signal curves not compared remain unconsidered, it can be achieved however that artifacts contained in these unconsidered sections possibly falsifying a parameter to be determined have no or at least less influence on the values determined of the parameters to be determined, in particular when the selected sections are not affected by the artifacts to be avoided.

By a signal comparison 103 (or also 105) of at least one section of the signal curve of an acquired picture element time series BZS with a corresponding section of the comparison signal curves D, a value P (or also P') of a parameter can be determined from the compensation data obtained with the aid, which is compensated for (block 109) with the use of compensation data obtained from at least parts of the acquired picture element time series BZS, so that a compensated value P* of the parameter is determined, which can replace the previously determined value P (or P') of the parameter.

As will be described below in relation to FIG. 4, a value of a local basic magnetic field B0 present can be determined by the signal comparison for each picture element, and matching data can be obtained from the signals of the acquired picture element time series, which can be established for example in the form of coarsely resolved parameter values, in particular local magnetic field values, and with the use of that data as compensation data, artifacts in the parameter values can be removed or at least reduced, so the parameter values thus matched are artifact-free or at least less affected by artifacts and an increased range of values of the compensated parameter values by contrast with the range of values of the not yet compensated parameters can be achieved.

On the basis of values P or P' of a parameter in a pixel element determined with an inventive signal comparison 103 or 105 the picture element-time series acquired for this picture element can be corrected (block 111), so that a corrected picture element time series BZS' is created.

The first signal comparison 103 of at least one section of the signal curve of an acquired picture element time series BZS with a corresponding section of the comparison signal curves D enables a value P of a measurement-specific parameter such as e.g. the local magnetic field B0, to be determined. On the basis of the value P of the parameter determined the acquired picture element time series BZS can be corrected to a corrected picture element time series BZS'.

It is thus possible for the picture element time series BZS acquired for the MRF method to be corrected by means of parameter values derived from the picture element time series itself.

If the picture element time series is acquired, for example, in accordance with a spiral-shaped sampling of k-space, the picture element time series can be affected as described above by off-resonances with blurring artifacts. These can be corrected by the method described in an especially efficient way by local B0 values, which have been determined by a signal comparison from the picture element time series itself.

Off-resonance correction methods (also "deblurring methods") for this purpose are already known, in particular for spiral-shaped k-space samplings. As a rule these previously required a separate measurement of a B0 map. With the method described here this type of separate measurement of a B0 map can be omitted and the values determined from the signal comparison can be used directly for the basic magnetic field B0. On the basis of the information obtained about the spatial distribution of the basic magnetic field B0, the data measured with the spiral-shaped k-space sampling can be manipulated such that the blurring no longer occurs. A frequency-segmented method is widely used for example, in which a B0 map previously measured separately is segmented after n off-resonances. The data measured with the spiral-shaped k-space sampling is reconstructed with the inclusion of various off-resonances, i.e. n images for n off-resonances are reconstructed. On the basis of the B0 map segmented in this way a selection is made for each picture element as to which of the n images contains the correctly reconstructed picture element. Other known correction methods can also be employed, which carry out a correction of image data on the basis of parameter maps, wherein the parameter maps needed as part of the method described here are not determined separately, but can be determined directly from the picture element time series by at least one signal comparison with comparison signal curves.

To take account of the results of a preceding signal comparison 103 or 105 in a further signal comparison 105, the further signal comparison of at least one section of the signal curve of a picture element time series BZS' corrected in this way can be compared with a corresponding section of the comparison signal curves D for improved determination of the values P' of the parameters to be determined.

The correction 111 of the picture element time series BZS and renewed determination of the values P' of the parameters to be determined enables the spatial resolution and also the precision of the values P' to be determined in an improved manner to be increased.

A correction of this type 111 can be carried out a number of times, so that a corrected picture element time series BZS' can be corrected once again on the basis of a value P' of the parameter determined by signal comparison of the corrected picture element time series BZS' with the comparison signal curves D, and the value P' of the parameter determined once again by comparison of the picture element time series BZS' corrected once again with the comparison signal curves D.

To this end an interrogation 115 can check for example whether a desired number of corrections have been carried out. If they have (interrogation 115, y), the values P' of the parameters to be determined can be stored after the last correction of the picture element time series BZS or BZS' and/or output (block 107). If they have not (interrogation 115, n), a renewed correction of the picture element time series BZS or BZS' can be carried out.

It is also conceivable to carry out renewed corrections (iteratively) until such time as a difference between values P' of the parameters determined once again and the corresponding values P or P' of the parameter determined before the renewed correction is less than a specific threshold value S.

To this end, in addition or as an alternative, the interrogation 115 can form the difference of the values P, P' determined after the last two corrections and compare it with the predetermined threshold value S. If the said condition is fulfilled (interrogation 115, y), the values P' determined after the last correction of the picture element time series BZS or BZS' of the parameters to be determined are stored and/or output (block 107). If it is not fulfilled (interrogation 115, n), a renewed correction of the picture element time series BZS or BZS' can be carried out.

The method described thus allows a correction, also possible iteratively, and thus an avoidance of artifacts, e.g. of off-resonance artifacts ("deblurring"), in picture element time series used for a determination of parameter values in MRF methods and thus likewise a correction and thus avoidance of these types of artifacts in the parameter values determined.

If the local values P' of at least two different parameters are to be determined, the values of the parameters to be determined overall can be divided into two groups G1, G2, of which only values of the group G1 are determined in an improved manner, while the values of the other group G2 are restricted in such a way that they may only deviate in accordance with a predetermined fluctuation SW from the value determined in a preceding signal comparison (block 113). Thus, to take into account the results of a preceding signal comparison in signal comparisons for improved determination of the values P' of at least one parameter G1 to be determined, the value or values P, P' of at least one parameter (G2) other than the parameter G1 currently to be determined in an improved manner is limited to a predetermined maximum fluctuation SW, in particular kept constant compared to the result of the preceding signal comparison (block 113). Thus, in a further signal comparison 105, only values of parameters G1 to be determined in an improved manner can be determined in an improved manner, while the values P2 of the remaining parameters may in any event deviate slightly from a value determined in a preceding signal comparison. In this way a dedicated improved determination of the values P' of individual or fewer parameters G1 is achieved.

Signal comparisons for improved determination of a value P' of a parameter to be determined are carried out until such time as all values P' of the parameters to be determined have been determined at least once with the improved determination.

To this end the interrogation 115, in addition or as an alternative, can monitor whether values P' have been determined in an improved manner for all parameters to be determined, and if necessary whether all values of parameters G1 to be improved in a dedicated manner have been determined. If each desired condition of the said conditions is fulfilled (interrogation 115, y) values P' determined in an improved manner of parameters to be determined are stored and/or output (block 107). If this is not the case (interrogation 115, n) a further signal comparison can be carried out for improved determination of a parameter not yet determined in an improved manner.

Figure 3:
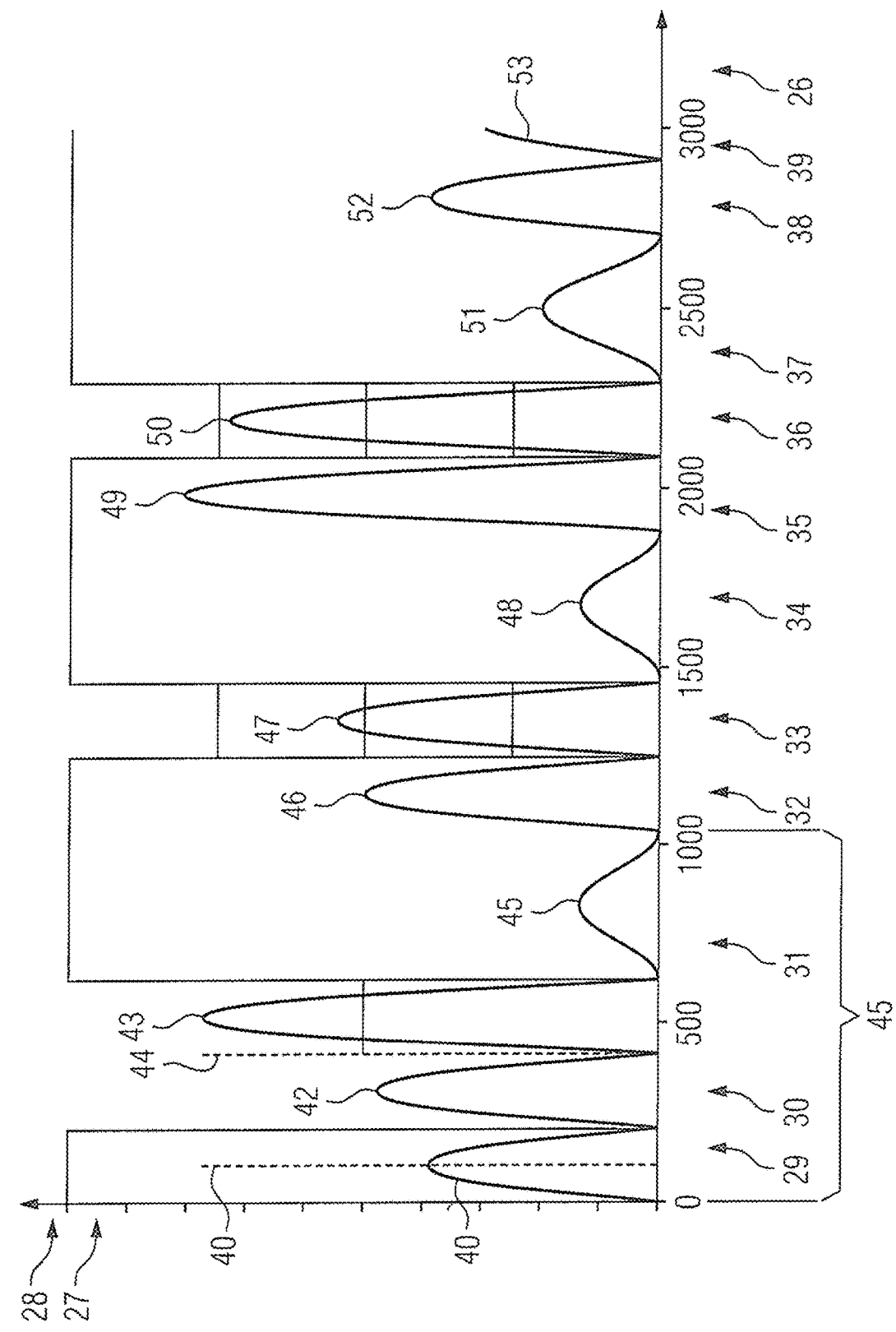
FIG. 3 shows a possible recording scheme for a picture element time series in accordance with the invention.

FIG. 3 shows a schematic illustration of a recording method for recording at least one picture element time series, as can be employed for the inventive method. The example shown shows a recording method for acquiring picture element time series in which three different sequence types with characteristics of sequence types from the group of sequence types TrueFISP ("True Fast Imaging with Steady-state free Precession"), FISP ("Fast Imaging with Steady-state free Precession") and FLASH ("Fast Low-Angle Shot") are employed. The characteristics of the sequence types relate in particular to the sensitivity of the respective sequence types to variation of tissue-specific and/or measurement-specific parameters. For example a FISP sequence is less sensitive to variations of the basic magnetic field B0, a trueFISP sequence on the other hand is more strongly sensitive to variations of the basic magnetic field B0. FLASH sequences and FISP sequences are sensitive to local variations of a radiated-in radio-frequency field B1+.

In the example shown in FIG. 3 the respective numbers of image datasets recorded in the time series are plotted on the axis 26 and various variables are plotted on the axis 27. Plotted as the first variable is the flip angle in ° from 0° at its origin to 90° at the axis point 28. In the example shown the axis 26 runs from image dataset 1 to image dataset 3000.

The 3000 image datasets are divided into twelve sections 29, 30, 31, 32, 33, 34, 35, 36, 37, 38 and 39.

In the first section 29 the flip angle that has been used for the recording is plotted over the curve 40 for two hundred image datasets, wherein a FISP sequence can be employed for the recording in section 29. As is described for FIG. 1, after the application of an RF excitation pulse with a specific flip angle, a complete image dataset is recorded and then the next RF excitation pulse with the next flip angle is applied and a further image dataset recorded. FIG. 3 shows in section 29 a flip angle distribution that corresponds to a $sine^2$ half curve. The maximum flip angle can amount to 24° for example and constant phases can be used.

A line 41 is entered purely by way of example for the hundredth image dataset. The corresponding flip angle is the maximum flip angle of the curve 40.

In the second section 30 in the example shown, four hundred image datasets are acquired with another sequence type, for example with a TrueFISP sequence. In this case flip angles in accordance with the curves 42 and 43 are employed. With the curve 42 these extend up to 45° and with the curve 43 up to 72°.

Also entered solely as an example for section 30 is a line 44 at the flip angle for the four hundredth image dataset. Here the flip angle amounts to 1°.

The use of two different phase cycles represents a special feature in section 30. When running through the flip angles of the curve 42 a 00 phase cycle or no phase cycle is used and when running through the curve 43 a 180° phase cycle. A 00 phase cycle designates a static phase.

In the following section 31, in the curve 45, the flip angles for recording four hundred and fifty image datasets with a further sequence type, for example a FLASH sequence, are specified. These are smaller than with the FISP or TrueFISP sequence and run up to 6°. Their distribution is also a $sine^2$ distribution.

In addition to the variation of the flip angles, when the FLASH sequence is run repeatedly, a phase cycle for realizing an RF spoiling is applied. In this case, as described, the phase is increased by multiples of 117°.

The order of the different sequence types used in the sections 29, 30 and 31 together form a block 45. This is used a total of three times in FIG. 3. In this case it is solely geared to the sequence but not to the number of the image datasets or the flip angle curve.

In section 32 200 image datasets are again recorded with the first sequence type of the block 45, i.e. for example with an FISP sequence. The phase is constant as in section 29, but the maximum flip angle amounts to 45°. The flip angles used lie on the curve 46.

200 image datasets follow in section 33, which are to be acquired with the second sequence type of block 45, i.e. for example with a TrueFISP sequence. A 90° phase cycle is employed here, the maximum flip angle lies at 50°. The flip angles are plotted on the curve 47.

The next appr. 450 image datasets in section 34 are to be recorded, as in section 31, with the third sequence type of the block 45, i.e. for example with a FLASH sequence. The curve 48 shows a $sine^2$ distribution with a maximum value of 14°.

Curve 49 in section 35 runs up to 72° and shows the flip angles of the radio-frequency pulse 19 when the first sequence type of the block 45 is used for the third time, i.e. for example with an FISP sequence. In this run too, the phase is constant.

On acquisition of a further two hundred image datasets with the second sequence type of block 45, i.e. for example with a TrueFISP-sequence, a 270° phase cycle is employed. The flip angles that are plotted in the curve 50 in section 36 run up to 65°.

The next appr. 450 image datasets in section 37 are recorded with the third sequence type of block 45, i.e. for example with the FLASH sequence. The curve 51 represents a flip angle course up to a maximum of 20°, once again $sine^2$ distributed.

In the last section 38 lie two curves 52 and 53 for recording of image datasets with the first sequence type of block 45, i.e. for example with an FISP sequence. These again represent flip angle curves. As already in the preceding sections, a constant phase is used for example for the measurement data recording with an FISP sequence.

Through its design with sections of different sequence types with different sensitivities, the example shown allows a determination of a number of tissue-specific and measurement-specific parameters in a matching step, in particular the parameters T1, T2 and also B0 and B1+ can be determined. The example shown is not to be read as restrictive however. The acquisition of a picture element time series can basically also be undertaken with the use of just one sequence type. The use of a number of different sequence types with different characteristics, in particular with reference to the respective sensitivities to tissue-specific and/or measurement-specific parameters, increases the number of parameters able to be determined however from a picture element time series recorded in this way and/or the quality of the values of the parameters determined according to the characteristics of the sequence types used.

Also the numbers of image datasets shown recorded with a sequence type as well as the flip angle curves shown are only to be seen as an example.

In FIG. 4 spatial distributions of specific basic magnetic field values B0 in an examination object are shown as an example to illustrate a matching process. During the recording of the measurement data from which the image data has been reconstructed, of which signal curves per picture element are to be compared as picture element time series with comparison signal curves for determination at least of the local values of the basic magnetic field B0, for clarifying the effect a linear curve of the basic field magnet B0 "from top to bottom" is created in the examination object.

The spatially-resolved distribution of local magnetic field values (B0 map) in an examination object shown on the left corresponds to the local magnetic field values determined with a signal comparison of picture element time series with comparison signal curves determined by picture element, wherein the comparison signal curves used for the signal comparison are comparison signal curves of a dictionary, of which the comparison signal curves cover a smaller range of B0 values than B0 values that occur in the examination object. The B0 map shown on the left thus covers e.g. B0 values in a range of −40 to +40 predetermined by the recording type of the underlying measurement data of the picture element time series and the corresponding comparison signal curves (the dictionary) in any given units.

The difference B0 map shown in the middle corresponds to a difference image of the B0 map shown on the left with a spatially roughly-resolved B0 map, which consists of specific B0 values derived from the B0-sensitive sections of the picture element time series, and thus covers B0 values in infinitesimally small steps. The roughly-resolved B0 map can be determined for example from sections of the picture element time series in which the measurement data was recorded with a sequence type with characteristics of a FISP sequence, by determination of the phase differences of the signals in the said sections of the picture element time series, which were recorded at different echo times, if necessary using a smoothing operation.

If the difference B0 map of the spatially roughly resolved B0 map and the B0 map shown on the left created by signal comparison is rounded up to multiples of 1/TR, segments are produced that correspond to multiples of 1/TR (in the example shown five such segments can be seen). If the result of this rounding is subtracted from the artifact-affected B0 map (on the left), a compensated, unwrapped B0 map is obtained as is shown on the right. The B0 map shown on the right then well reflects the linear course of the basic magnetic field B0 created artificially during the measurement even by the described processing with the rough B0 map in a rough range of values, in the example shown in a range of −200 to +200 in the same units as in the B0 map shown on the left.

Use is made here of the fact that matching data can already be obtained from the signals of the picture element time series used without a signal comparison, e.g. by at least roughly resolved determination of local values of a parameter to be determined, in particular of a measurement-specific parameter, such as the local magnetic field B0, with said matching data able to be used for compensating for, e.g. unwrapping parameter values determined by means of signal comparison. Although the resolution of such a roughly resolved parameter map is not directly sufficient as the result of a local distribution of the parameter values, the parameter values of the roughly resolved parameter map can be used as compensation data, in order to compensate for more highly resolved parameter maps, which have been obtained by means of signal comparison, for example for unwrapping them as in the example described above.

Thus compensated values of the parameters determined for the picture element time series can be determined in the high resolution of the created picture element time series, which can improve previously determined values of the respective parameter and in this way compensate for artifacts, wherein even the range of the values able to be achieved in the determination of the compensated parameter values can be enlarged by comparison with the range of values able to be achieved with a pure signal comparison.

With an MRF recording method that allows the determination of the parameters T1, T2, B0 and B1+, an example of a possible execution sequence of an inventive method for determination of the local parameter values of the parameters T1, T2, B0 and B1 with a multi-stage determination of the local parameter values could appear as follows.

After a first signal comparison of the acquired picture element time series with comparison signal curves, in which in particular the entire signal curve of the picture element time series has been compared with the respective overall curve of comparison signal curves, local values (maps) are determined for all parameters T1, T2, B0 and B1+.

A B0 map determined in this way can be affected by artifacts similar to unwrapping artifacts and initially compensated for, as described above in relation to FIG. 4, in particular unwrapped, so that a compensated B0 map is obtained.

On the basis of the B0 map determined by means of the first signal comparison and if necessary compensated, there can initially be a correction as above, in particular a deblurring, of the acquired picture element time series, whereby possible blurring artifacts are removed or at least reduced and picture element time series corrected accordingly are obtained.

In a second signal comparison the picture element time series corrected in this way can be compared with the comparison signal curves, in order to achieve an improved determination of the parameters T1, T2, B0 and B1+. Here the complete signal curve of the corrected picture element time series can again be compared with the complete curve of the comparison signal curves.

In order to further improve the values of the parameter B1+ determined, in a next signal comparison just those sections of the (corrected) picture element time series can be compared with corresponding sections of the comparison signal curves that were recorded with a FLASH(-type) sequence, wherein only the value of the parameter B1+ is determined, but the values of the other parameters T1, T2, B0 are restricted however to a predetermined maximum fluctuation compared to the corresponding preceding values determined, wherein the value of the parameter B0 can also be kept constant. In this way the flow artifacts possibly corrupting the values of B1+ determined can be eliminated or at least reduced, since the sections of the signal curves used for this signal comparison are not sensitive or at least are less sensitive to a possible flow of spins. Thus an improved B1+ map is obtained, which can further be smoothed with a smoothing method, which comprises image-specific filters for example.

In a further signal comparison the entire signal curve of the corrected picture element time series can be compared again with the comparison signal curves, in order to determine the values of the parameters T1, T2 and B0 again and in an improved manner, wherein the values of the parameter B1+ already determined in the preceding signal comparison in an improved manner can be kept constant.

In this way, values for the parameters to be determined are obtained step-by-step in an improved manner, wherein an especially high precision is achieved and the artifacts corrupting the values determined can be eliminated or reduced.

Each of these steps can in particular also be carried out iteratively, in order to achieve a greater precision.

Figure 5:
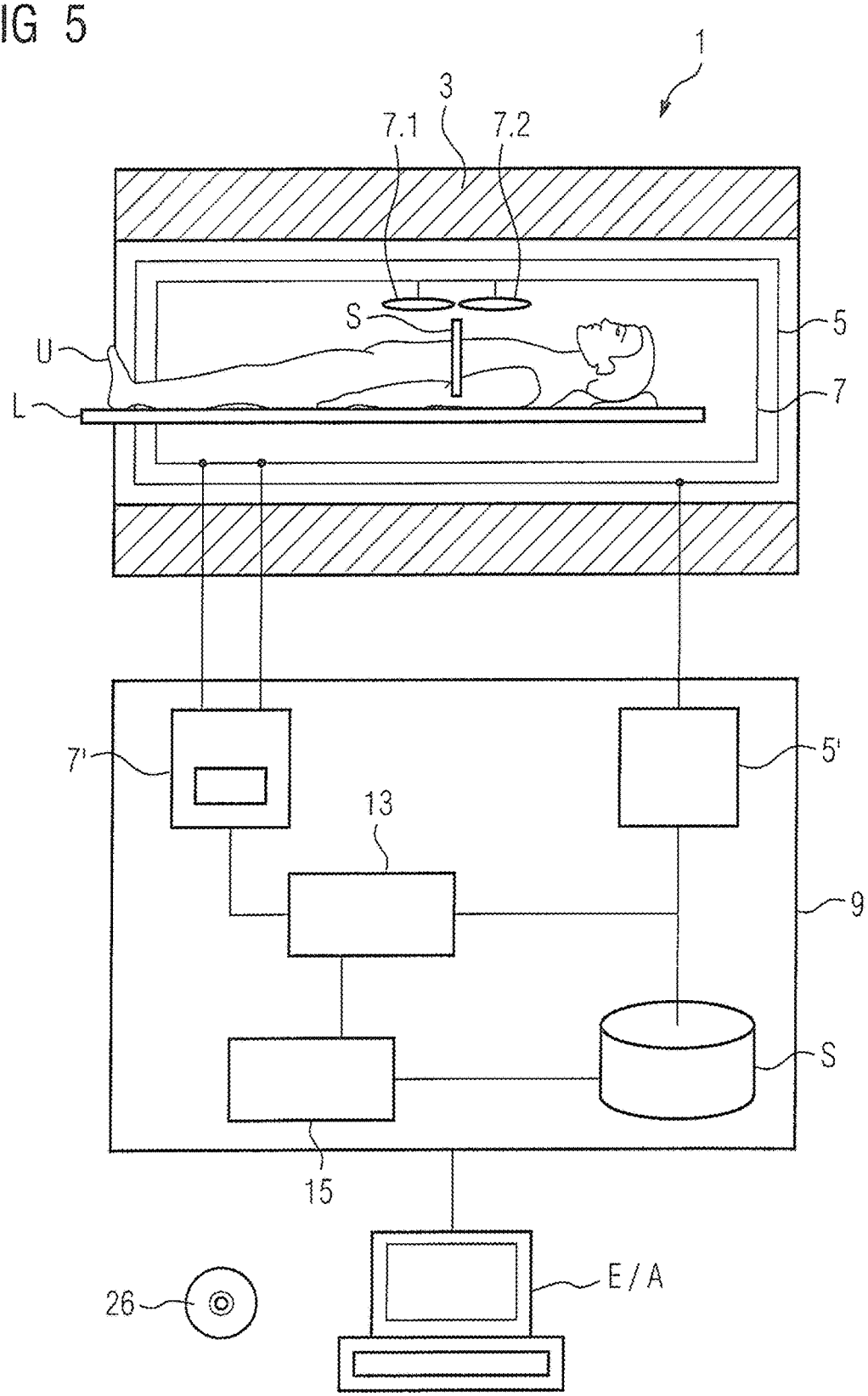
FIG. 5 schematically illustrates an inventive magnetic resonance apparatus.

FIG. 5 schematically illustrates an inventive magnetic resonance apparatus with an MR scanner 1. The scanner 1 has a basic field magnet 3 that produces the basic magnetic field B0, a gradient coil unit 5 for creating the gradient fields, a radio-frequency unit 7 for radiating and receiving radio-frequency signals, and a control computer 9 configured to implement the inventive method. In FIG. 5 these subunits of the magnetic resonance apparatus 1 are only shown schematically. The radio-frequency unit 7 can have a number of subunits, for example of a number of RF coils such as the coils 7.1 and 7.2 shown schematically, or more coils, which can be embodied just for radiating radio-frequency signals, or just for receiving the spatially resolved radio-frequency signals (MR signals) or for both.

For examining an examination object U, for example a patient or a phantom, the object U can be introduced on a bed L into the measurement volume of the scanner 1. The slice S represents an example of a target volume of the examination object U, from which measurement data are to be recorded.

The control computer 9 controls the magnetic resonance apparatus, and can control the gradient unit 5 via a gradient controller 5' and the radio-frequency unit 7 via a radio-frequency transmit/receive controller 7'. The radio-frequency unit 7 here can have a number of channels, in which signals can be individually sent or received.

The radio-frequency unit 7, together with its radio-frequency transmit/receive controller 7' is responsible for the creation and radiating (sending) of a radio-frequency alternating field for manipulation of nuclear spins in a region to be manipulated (for example in the slices S to be measured) of the examination object U. In this case the mid-frequency of the radio-frequency alternating field, also referred to as the B1 field, is set to be as close as possible to the resonant frequency of the spins to be manipulated. Deviations of the mid-frequency from the resonant frequency are referred to as off-resonance. For creating the B1 field currents controlled in the radio-frequency unit 7 by the radio-frequency transmit/receive controller 7' are applied to the RF coils.

The control computer 9 further comprises a parameter value determination processor 15, with which inventive signal comparisons for determination of parameter values can be carried out. The control computer 9 overall is designed to carry out the inventive method.

A central processor 13 of the control computer 9 is configured to carry out all processing operations needed for the measurements and determinations. Intermediate results and results needed for these operations can be stored in a memory M of the control computer 9. The shown units should not be understood necessarily as physically separate units, but merely represent a subdivision into virtual units, which can also be realized in fewer or in just one single physical unit.

Control commands can be conveyed to the magnetic resonance apparatus and/or results of the control computer 9, such as image data, can be displayed to a user via an input/output device E/A of the magnetic resonance apparatus 1.

The method described herein can also be present in the form of a computer program product embodied as program code stored on a non-transitory electronically-readable data storage medium 26. When the data medium 26 is loaded in the control computer 9 of the magnetic resonance apparatus 1, the program code cause the control computer 9 to implement the method described herein.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determination of parameter values in picture elements of an examination object by means of a magnetic resonance fingerprinting (MRF) technique, comprising the steps:

providing a computer with MRF data, comprised of picture elements acquired from an examination object, and in said computer, producing at least one picture element time series from which one value in each case of a parameter present in least one location of the examination object shown in the respective picture element is to be determined;

in said computer, making a signal comparison of at least one section of the respective signal curve of the acquired picture element time series with a corresponding section of comparison signal curves for determination of the respective values of the at least one parameter;

in said computer, making a further signal comparison of at least one section of the respective signal curve, taking into account the results of the preceding signal comparison with a corresponding section of the comparison signal curves, in order to determine the respective values of the at least one parameter; and in an output from the computer, representing the respective values of the parameters that were determined for the respective picture element.

2. The method as claimed in claim 1 comprising, in at least one signal comparison, comparing the signal curve in sections of an overall picture element time series to be compared, which has been acquired with a sequence type sensitive to the parameters to be determined, with the corresponding sections of the comparison signal curves.

3. The method as claimed in claim 1, comprising through a signal comparison of at least one section of the signal curve of the acquired picture element time series with a corresponding section of the comparison signal curves, a value of a parameter is determined, and the determined value of the parameter is compensated for by compensation data determined from at least parts of the acquired picture element time series, so that a compensated value of the parameter is determined, which replaces the previously determined value of the parameter.

4. The method as claimed in claim 3, wherein said MRF data are acquired with a scanner operating with a basic magnetic field B0, and wherein said parameter is said basic magnetic field B0.

5. The method as claimed in claim 1, comprising based on a value of a parameter determined for a picture element, correcting the picture element time series of the picture element, so that a corrected picture element time series is created.

6. The method as claimed in claim 5, comprising taking into account the results of a preceding signal comparison in a further signal comparison by, in the further signal comparison, comparing at least one section of the signal curve of a corrected picture element time series with a corresponding section of the comparison signal curves for improved determination of the values of the parameters to be determined.

7. The method as claimed in claim 5, comprising again correcting a corrected picture element time series based on a value of the parameter determined by signal comparison of the corrected picture element time series with the comparison signal curves, and determining the value of the parameter by comparison of the picture element time series corrected again, with the comparison signal curves.

8. The method as claimed in claim 7, comprising making renewed correction iteratively until a difference between values of the parameter determined again, and the corresponding values of the parameter determined before the respective renewed correction, is smaller than a predetermined threshold value (S).

9. The method as claimed in claim 1, wherein values of at least two different parameters are to be determined, and for the results of the preceding signal comparison in signal comparisons for determination of the values of at least one parameter to be determined, the value or the values of at least one parameter other than the current parameter to be determined is restricted to a predetermined fluctuation compared to the result of the preceding signal comparison.

10. The method as claimed in claim 9, comprising restricting said at least one parameter, other than the current parameter to be determined, to a predetermined fluctuation by keeping said at least one parameter constant.

11. The method as claimed in claim 9, comprising making signal comparisons for the determination of a value of a parameter to be determined until all values of the parameters to be determined have been determined at least once.

12. The method as claimed in claim 1, comprising producing the picture element time series with characteristics of the group of sequence types consisting of TrueFISP ("True Fast Imaging with Steady-state free Precession"), FISP ("Fast Imaging with Steady-state free Precession") and FLASH ("Fast Low-Angle Shot").

13. The method as claimed in claim 12, wherein said characteristic is a sensitivity of the respective sequence type.

14. The method as claimed in claim 1, comprising producing the picture element time series along a non-Cartesian sampling of k-space.

15. The method as claimed in claim 14, wherein said non-Cartesian sampling is a spiral-shaped sampling of k-space.

16. A magnetic resonance apparatus comprising:

a magnetic resonance data acquisition scanner configured to acquire magnetic resonance fingerprinting (MRF) data comprised of picture elements acquired from an examination object;

a computer provided with said MRF data, said computer being configured to produce at least one picture element time series from which one value in each case of a parameter present in at least one location of the examination object shown in the respective picture element is to be determined;

said computer being configured to make a signal comparison of at least one section of the respective signal curve of the acquired picture element time series with a corresponding section of comparison signal curves for determination of the respective values of the at least one parameter;

said computer being configured to make a further signal comparison of at least one section of the respective signal curve, taking into account the results of the preceding signal comparison with a corresponding section of the comparison signal curves, in order to determine the respective values of the at least one parameter; and said computer being configured to provide an output representing the respective values of the parameters that were determined for the respective picture element.

17. A non-transitory, computer-readable data storage medium encoded with programming instructions, said storage medium being loaded into a computer and said programming instructions causing said computer to:
- receive MRF data, comprised of picture elements acquired from an examination object, and to produce at least one picture element time series from which one value in each case of a parameter present in least one location of the examination object shown in the respective picture element is to be determined;
- make a signal comparison of at least one section of the respective signal curve of the acquired picture element time series with a corresponding section of comparison signal curves for determination of the respective values of the at least one parameter;
- make a further signal comparison of at least one section of the respective signal curve, taking into account the results of the preceding signal comparison with a corresponding section of the comparison signal curves, in order to determine the respective values of the at least one parameter; and
- in an output from the computer, represent the respective values of the parameters that were determined for the respective picture element.

* * * * *